United States Patent
Imonigie et al.

(10) Patent No.: US 11,361,972 B2
(45) Date of Patent: Jun. 14, 2022

(54) METHODS FOR SELECTIVELY REMOVING MORE-DOPED-SILICON-DIOXIDE RELATIVE TO LESS-DOPED-SILICON-DIOXIDE

(71) Applicant: Micron Technology, Inc., Boise, ID (US)

(72) Inventors: Jerome A. Imonigie, Boise, ID (US); Ramaswamy Ishwar Venkatanarayanan, Garden City, ID (US); Pranav P. Sharma, Boise, ID (US); Eric E. Kron, Meridian, ID (US); Sanjeev Sapra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 400 days.

(21) Appl. No.: 16/387,766

(22) Filed: Apr. 18, 2019

(65) Prior Publication Data

US 2020/0335351 A1 Oct. 22, 2020

(51) Int. Cl.
*H01L 49/02* (2006.01)
*H01L 21/311* (2006.01)

(52) U.S. Cl.
CPC ........ *H01L 21/31105* (2013.01); *H01L 28/91* (2013.01); *H01L 28/92* (2013.01)

(58) Field of Classification Search
CPC ..... H01L 21/31105; H01L 28/91; H01L 28/92
See application file for complete search history.

(56) References Cited

U.S. PATENT DOCUMENTS

| | | | |
|---|---|---|---|
| 3,960,559 A * | 6/1976 | Suzuki | G03F 7/0041 430/297 |
| 6,492,309 B1 * | 12/2002 | Behr | C11D 7/08 134/2 |
| 7,125,781 B2 | 10/2006 | Manning et al. | |
| 7,387,939 B2 | 6/2008 | Manning | |
| 7,713,813 B2 | 5/2010 | Raghu | |
| 8,957,306 B2 * | 2/2015 | Stan | H01L 31/1852 136/255 |
| 9,893,083 B1 * | 2/2018 | Wang | H01L 29/7883 |
| 2002/0056913 A1 * | 5/2002 | Eimori | H01L 27/10873 257/758 |
| 2002/0139387 A1 * | 10/2002 | Yates | C23G 1/02 134/1 |
| 2005/0061768 A1 * | 3/2005 | Fucsko | H01L 21/31111 216/2 |

* cited by examiner

*Primary Examiner* — Mohammad M Choudhry
(74) *Attorney, Agent, or Firm* — Wells St. John P.S.

(57) ABSTRACT

Some embodiments include a method in which an assembly is formed to have a first silicon-dioxide-containing-material and a second silicon-dioxide-containing-material. The first silicon-dioxide-containing-material has a higher concentration of dopant therein than does the second silicon-dioxide-containing-material. The first silicon-dioxide-containing-material is selectively removed relative to the second silicon-dioxide-containing-material using a mixture which includes hydrofluoric acid, a second acid and an organic solvent. The organic solvent may include at least one ester and/or at least one ether. The second acid may have a pKa of less than about 5.

24 Claims, 16 Drawing Sheets

US 11,361,972 B2

1

METHODS FOR SELECTIVELY REMOVING MORE-DOPED-SILICON-DIOXIDE RELATIVE TO LESS-DOPED-SILICON-DIOXIDE

TECHNICAL FIELD

Methods for selectively removing more-doped-silicon-dioxide relative to less-doped-silicon-dioxide.

BACKGROUND

Capacitors continue to have increasing aspect ratios in higher generation integrated circuitry fabrication. For example, dynamic random access memory (DRAM) capacitors may have elevations from 1 to 3 microns, and widths of less than or equal to about 0.1 micron.

A common type of capacitor is a so-called container device. A storage electrode of such device is shaped as a container. Dielectric material and another capacitor electrode may be formed within the container and/or along an outer edge of the container, which can form a capacitor having high capacitance and a small footprint.

Container-shaped storage nodes are becoming increasingly taller and narrower (i.e., are being formed to higher aspect ratios) in an effort to achieve desired levels of capacitance while decreasing the amount of semiconductor real estate consumed by individual capacitors. Unfortunately, high-aspect-ratio container-shaped storage nodes can be structurally weak; and may be subject to toppling, twisting and/or breaking from an underlying base.

Example methodology being developed to avoiding toppling of high-aspect-ratio containers is so-called lattice methodology, as described in, for example, U.S. Pat. Nos. 7,713,813, 7,125,781 and 7,387,939; all of which are assigned to Micron Technology, Inc. In such methodology, a lattice is provided to hold container-shaped electrodes from toppling, while leaving outer surfaces of the container-shaped electrodes exposed for utilization as capacitive surfaces of capacitors.

The high-aspect-ratio capacitors may be formed in high-aspect-ratio openings. It can be difficult to form the high-aspect-ratio openings due to, for instance, taper developing along bottoms of the openings. It would be desirable to develop new methods suitable for etching high-aspect-ratio openings, and for such new methods to be applicable to technology associated with the fabrication of high-aspect-ratio capacitors.

2

Figure 8:
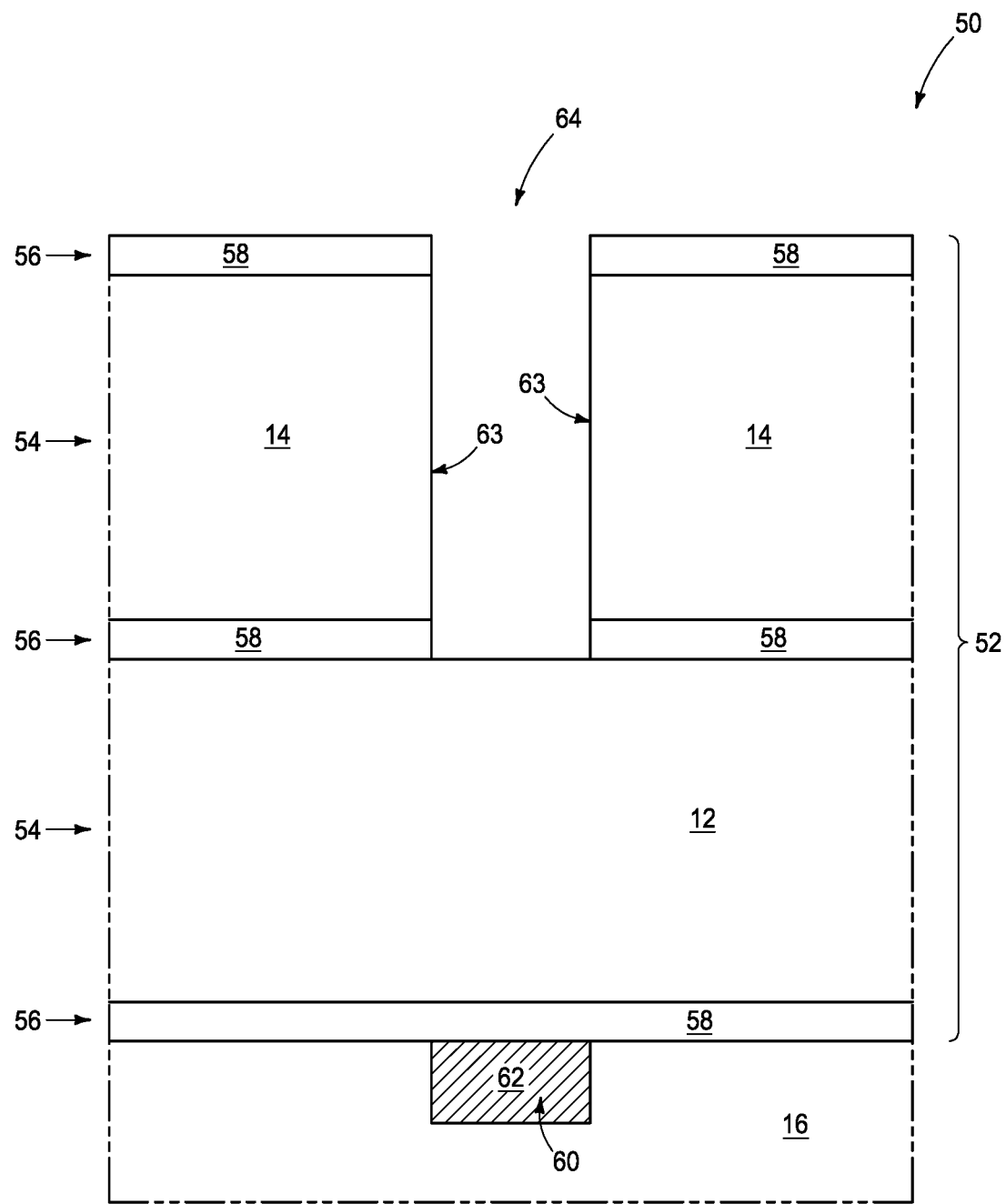
FIG. 8 is a diagrammatic cross-sectional side view of the example assembly of FIG. 7 shown at an example process stage following the process stage of FIG. 7.
Figure 8A:
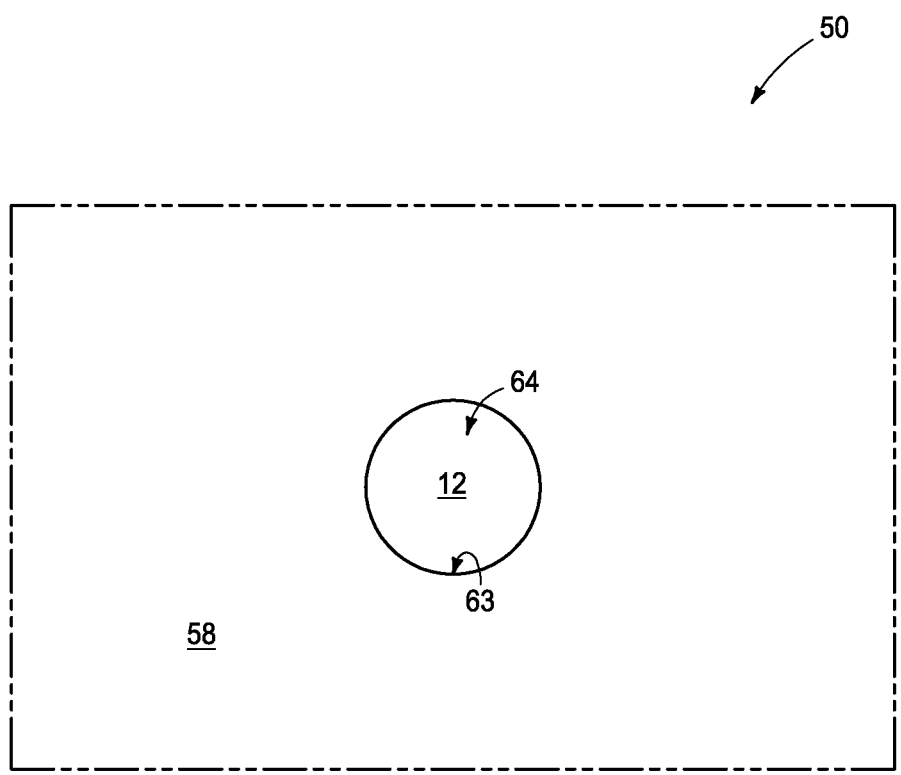

FIG. 8A is a diagrammatic top view of the example assembly of FIG. 8.

Figure 7:
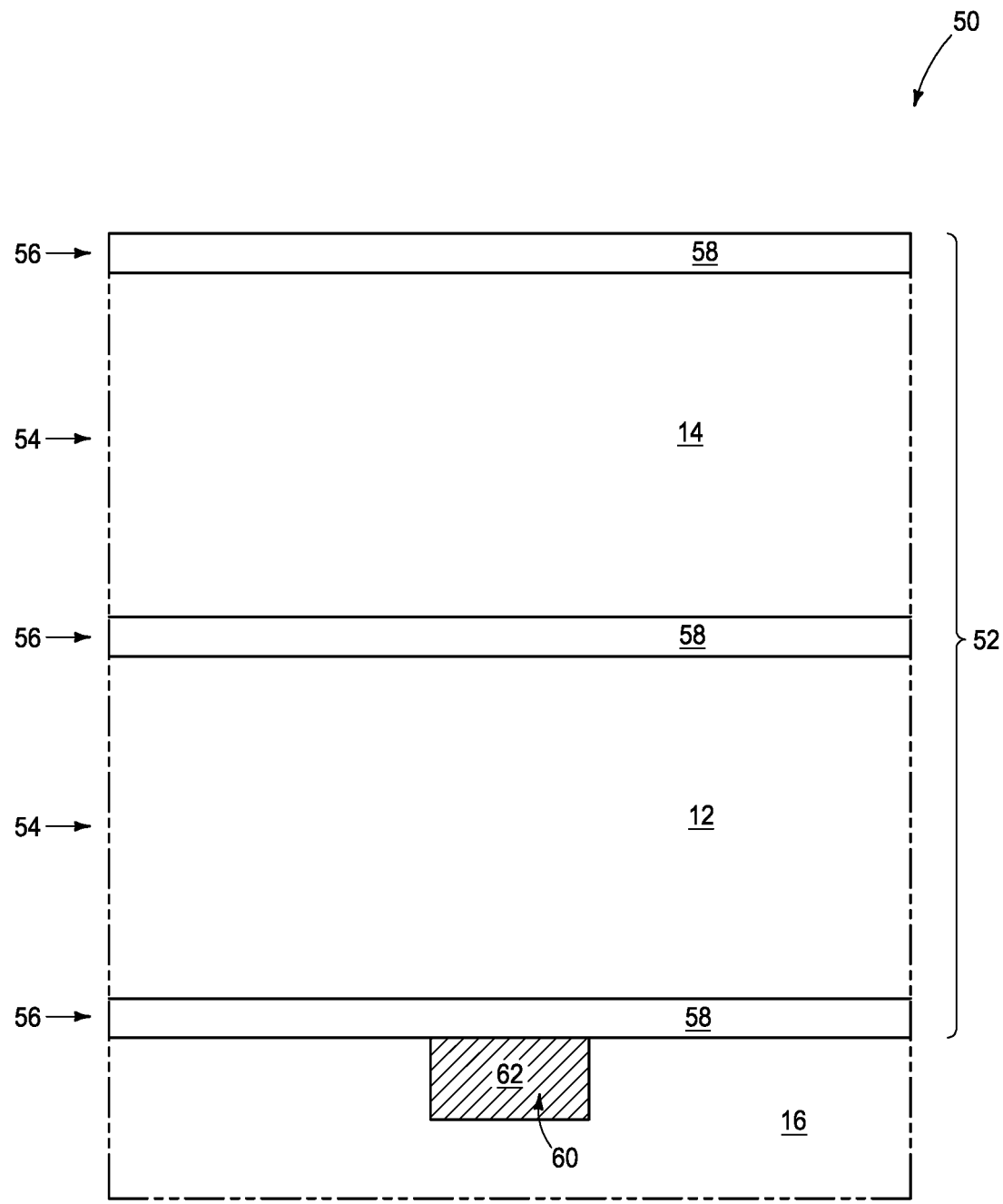
FIG. 7 is a diagrammatic cross-sectional side view of an example assembly at an example process stage of an example method.
Figure 9:
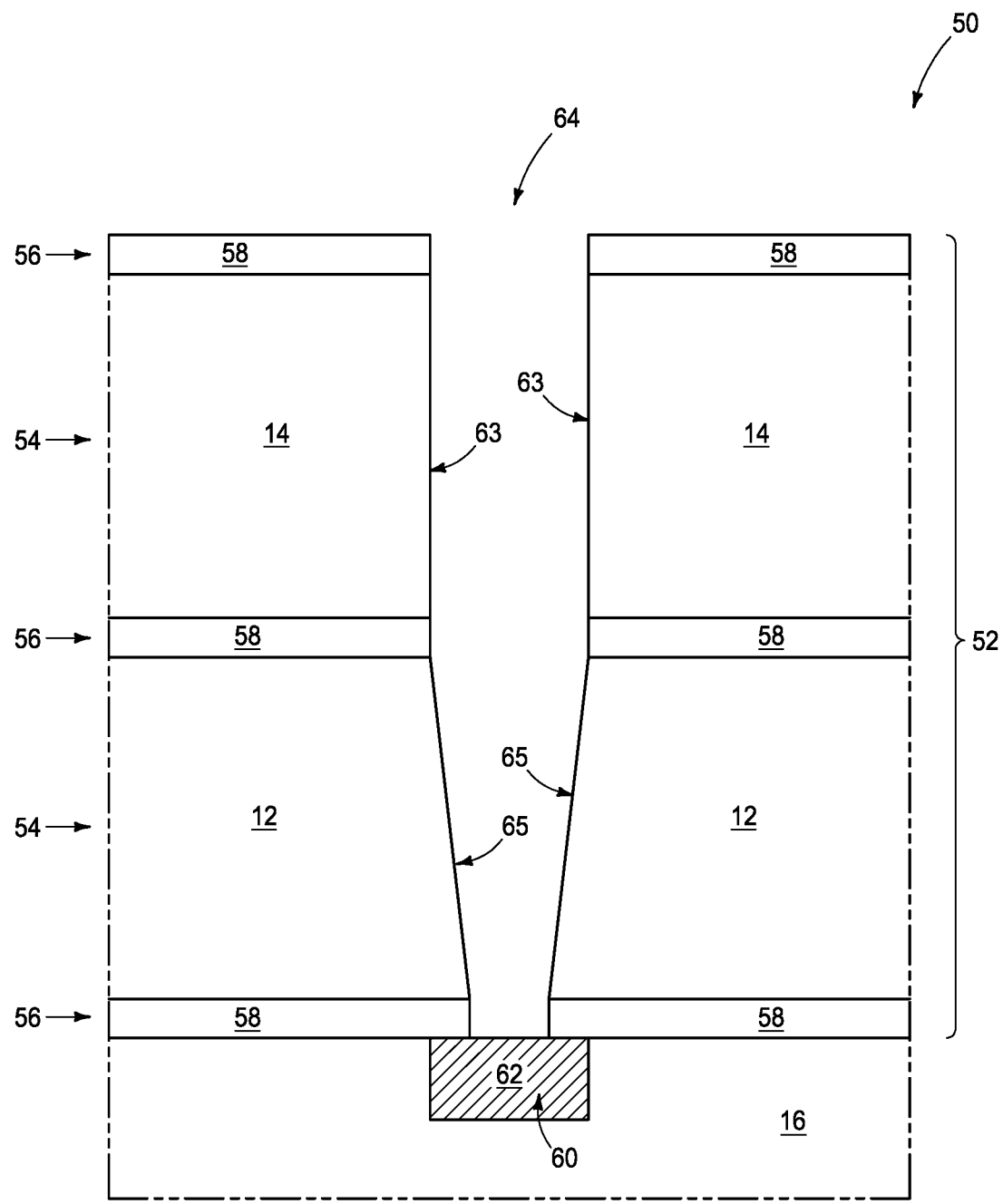

FIG. 9 is a diagrammatic cross-sectional side view of the example assembly of FIG. 7 shown at an example process stage following the process stage of FIG. 8.

Figure 10:
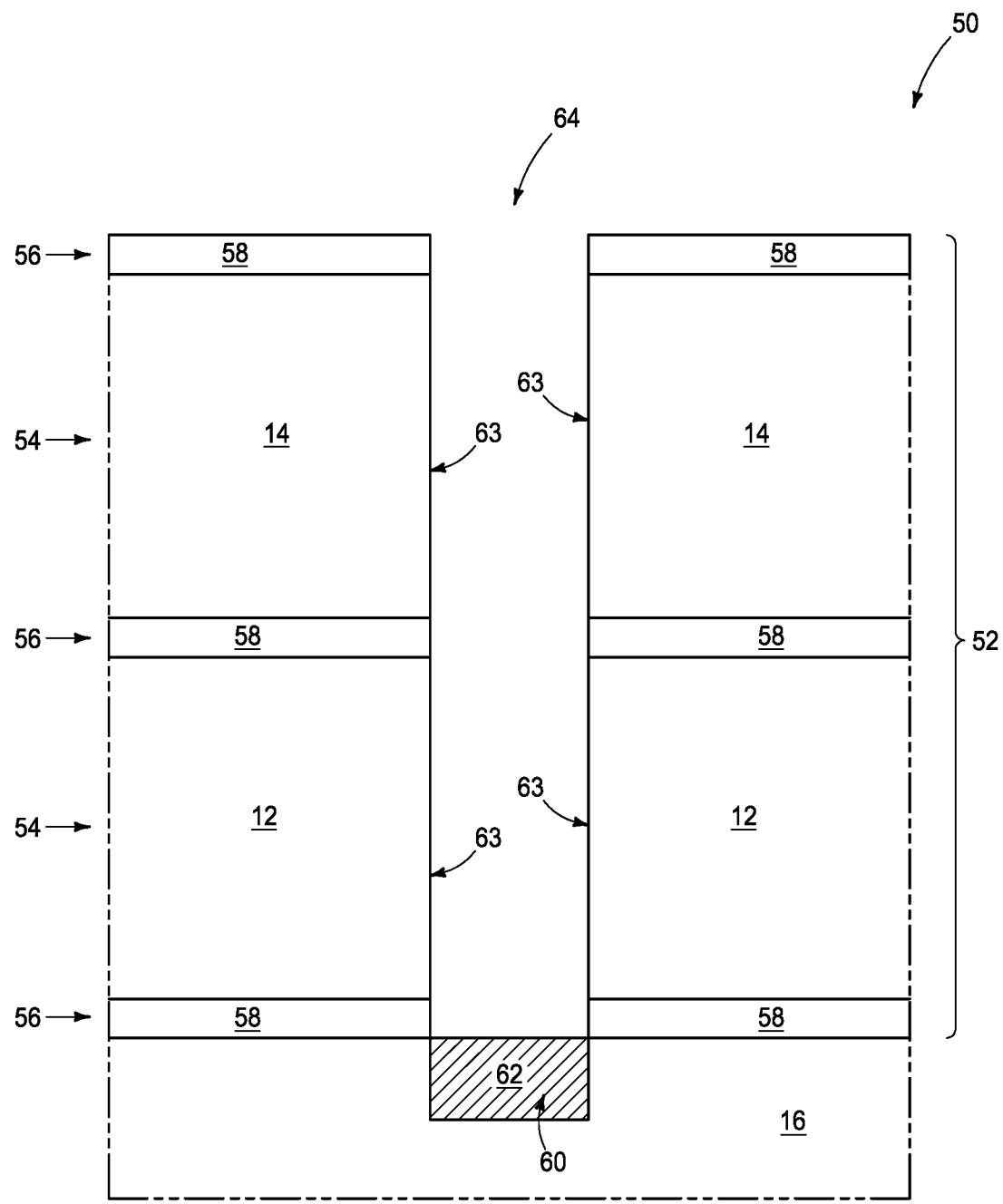

FIG. 10 is a diagrammatic cross-sectional side view of the example assembly of FIG. 7 shown at an example process stage following the process stage of FIG. 9.

Figure 11:
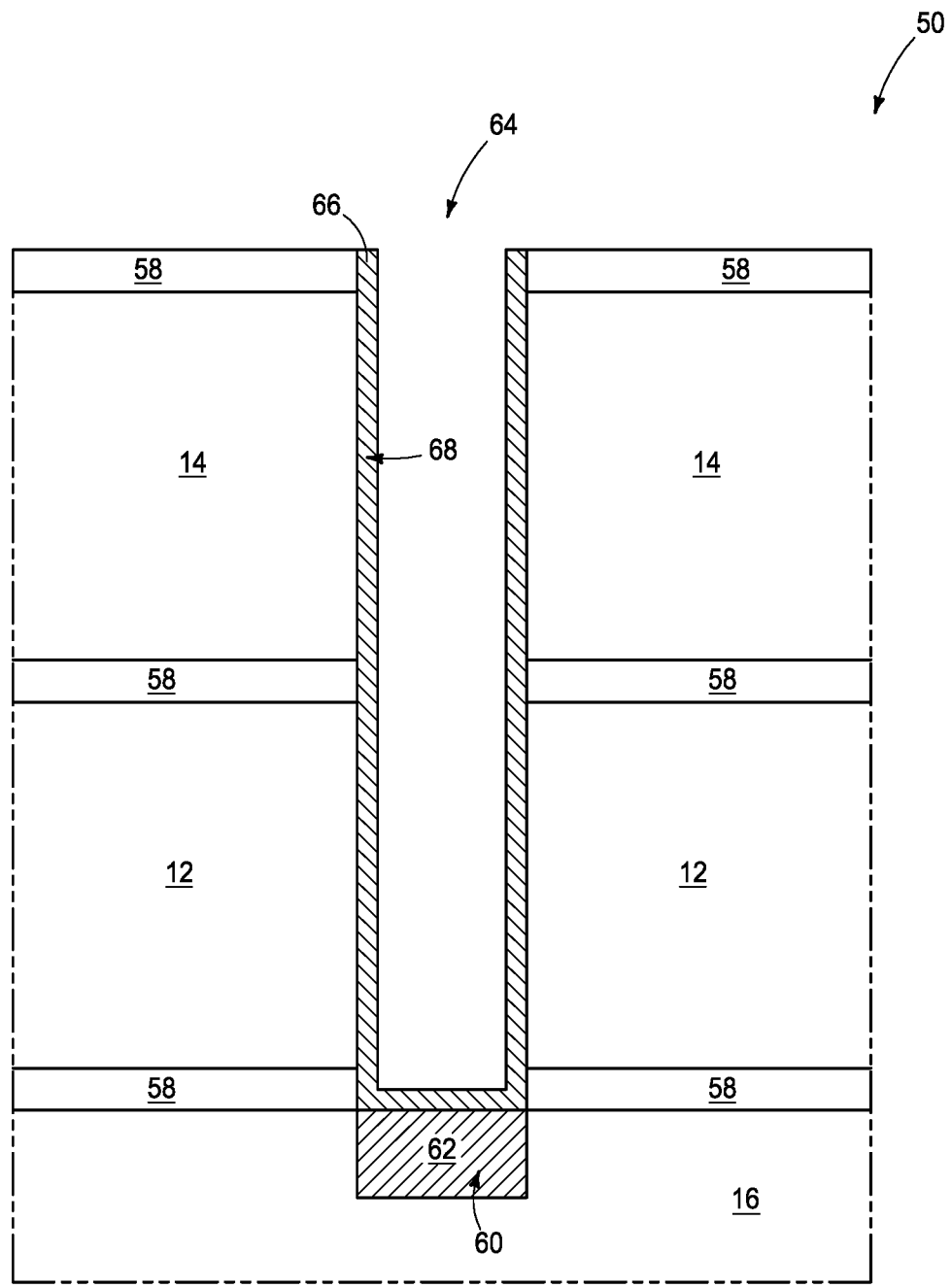

FIG. 11 is a diagrammatic cross-sectional side view of the example assembly of FIG. 7 shown at an example process stage following the process stage of FIG. 10.

Figure 12:
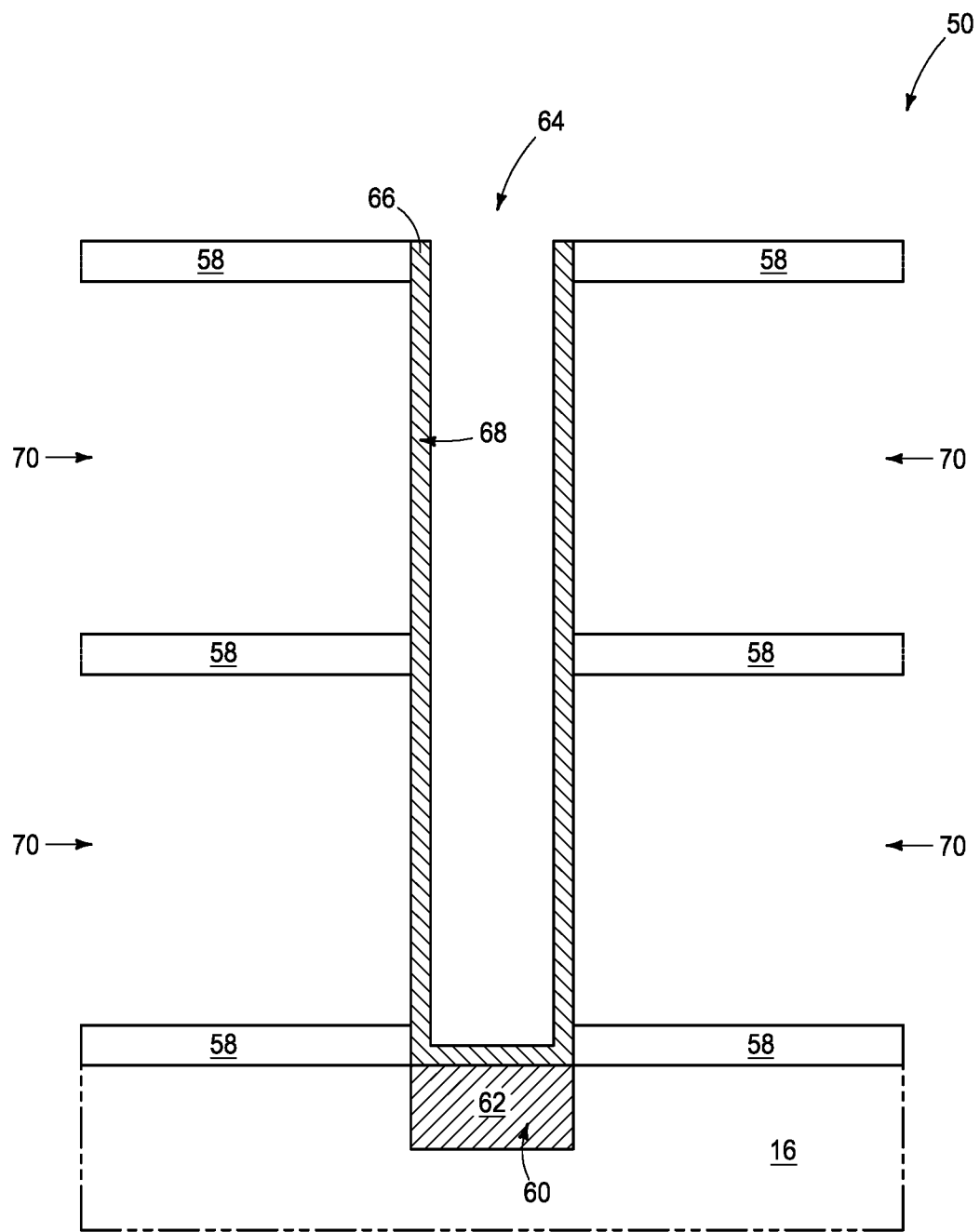

FIG. 12 is a diagrammatic cross-sectional side view of the example assembly of FIG. 7 shown at an example process stage following the process stage of FIG. 11.

Figure 13:
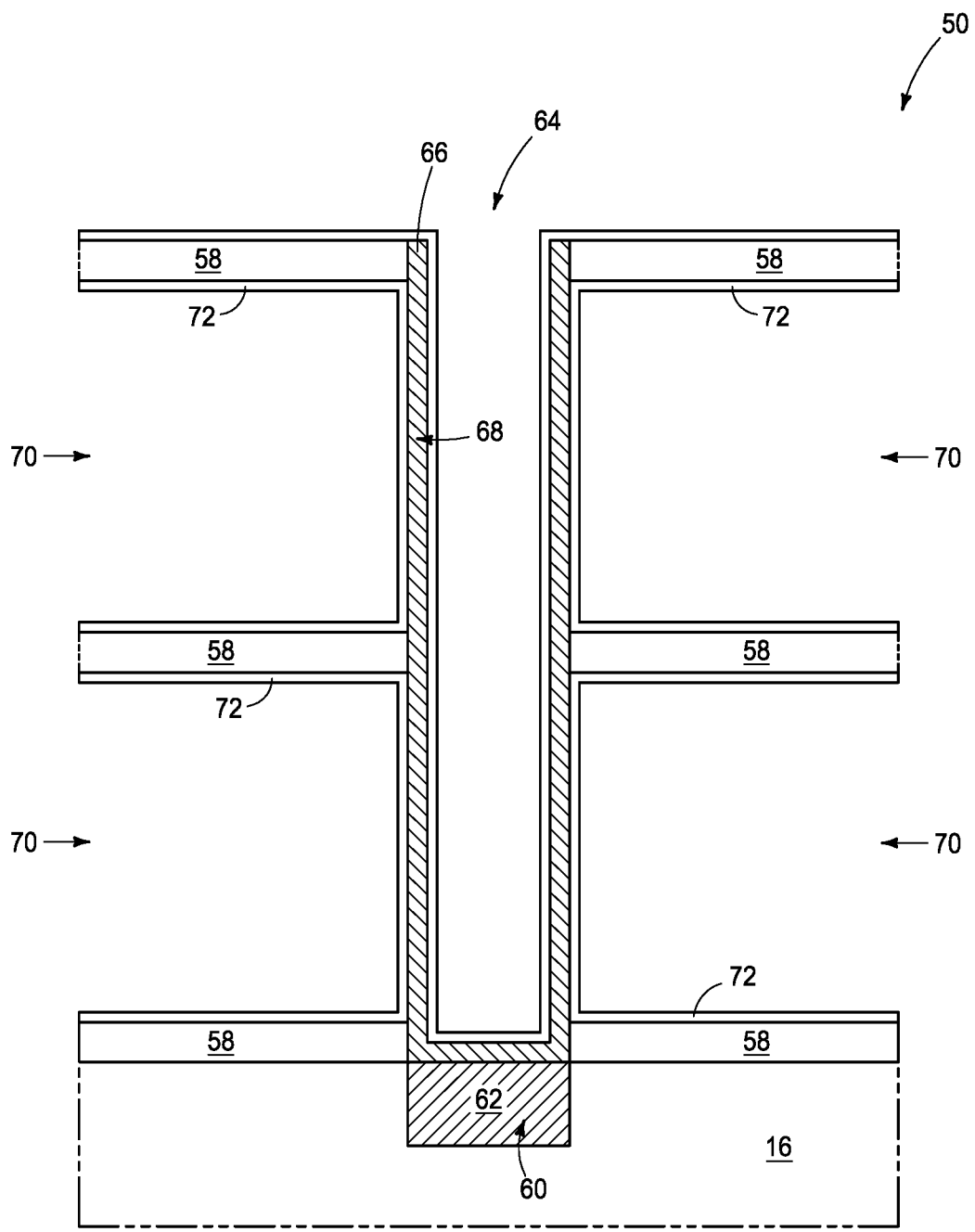

FIG. 13 is a diagrammatic cross-sectional side view of the example assembly of FIG. 7 shown at an example process stage following the process stage of FIG. 12.

Figure 14:
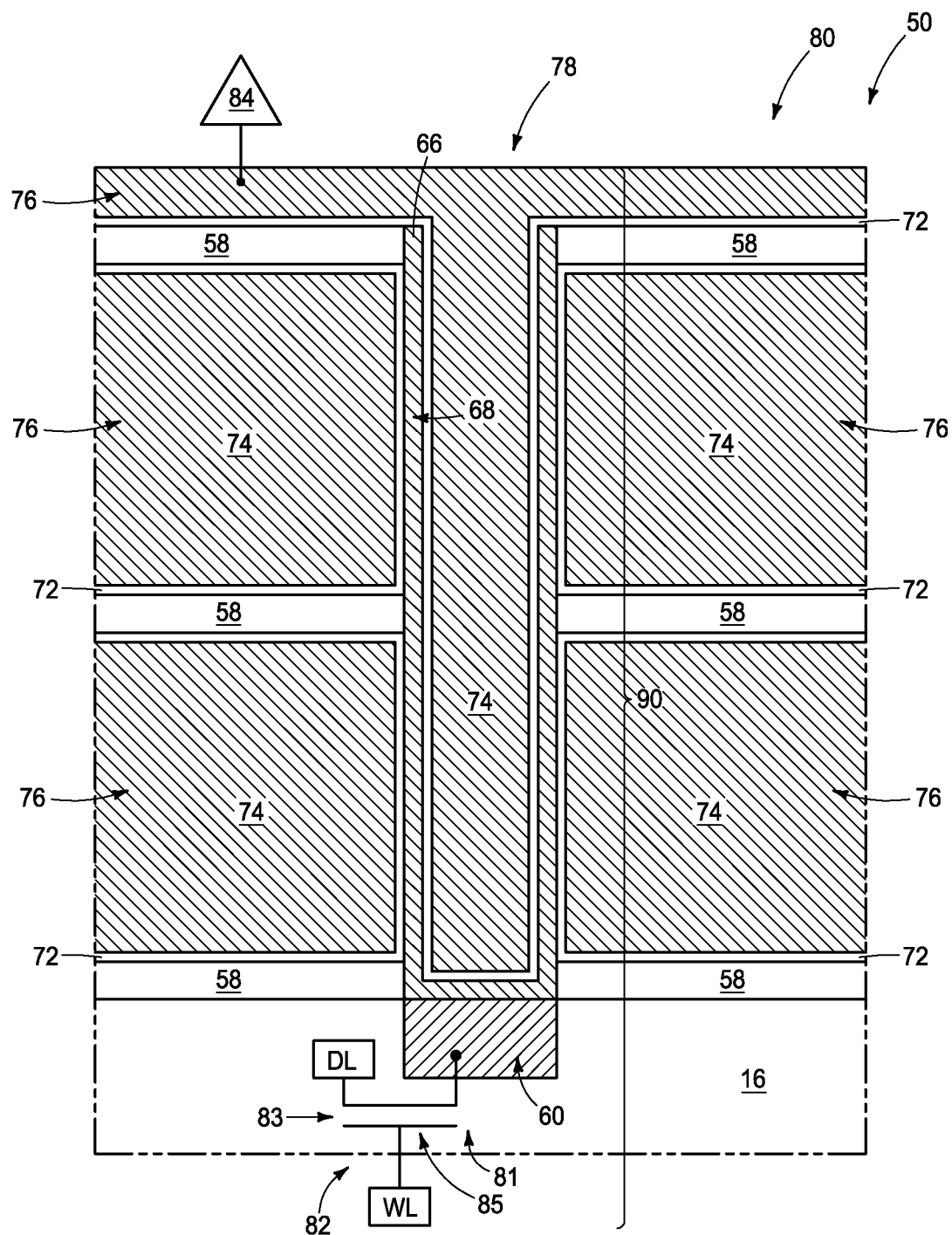

FIG. 14 is a diagrammatic cross-sectional side view of the example assembly of FIG. 7 shown at an example process stage following the process stage of FIG. 13.

Figure 15:
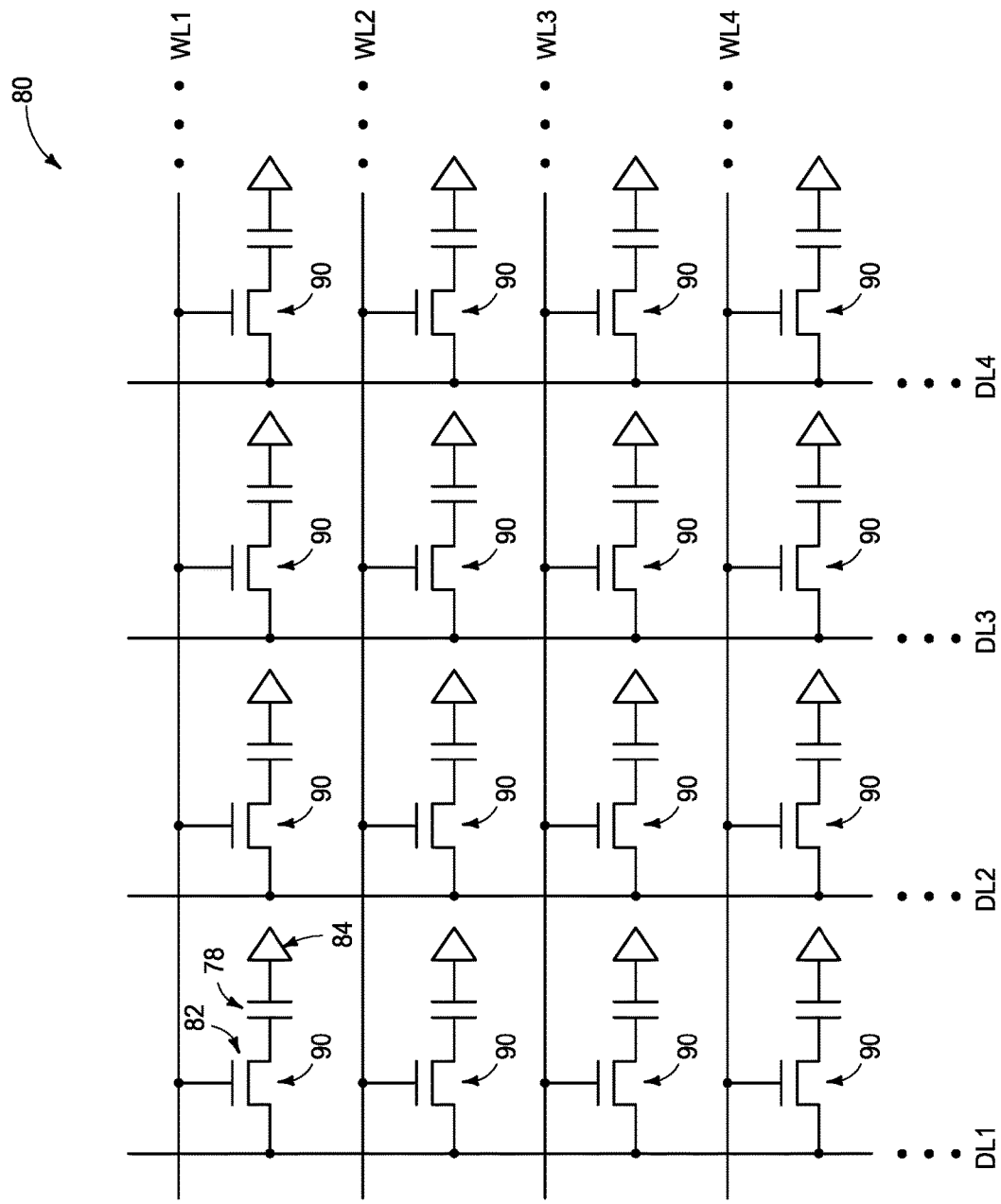

FIG. 15 is a diagrammatic schematic view of a region of an example memory array.

DETAILED DESCRIPTION OF THE ILLUSTRATED EMBODIMENTS

Some embodiments include methods of selectively removing a first silicon-dioxide-containing-material relative to a second silicon-dioxide-containing-material. The first silicon-dioxide-containing-material comprises a higher concentration of dopant (e.g., phosphorus, boron, arsenic, etc.) than the second silicon-dioxide-containing-material. In some embodiments, the methods are applied to the fabrication of capacitors.

The removal of silicon dioxide may utilize chemistry based on hydrofluoric acid and/or components derived therefrom as etchant(s). Example chemistries are described with reference to equations (1) and (2) in FIG. 1.

The first equation "(1)" shows the dissociation of aqueous hydrofluoric acid (HF) into protons and fluoride ions. The undissociated HF is a preferred species for etching doped silicon dioxide; such as, for example, silicon dioxide doped within one or more of arsenic, phosphorus and boron to a total concentration within a range from about 0.5 weight percent (wt %) to about 10 wt %.

The second equation shows the aqueous HF combining with a fluoride ion to form $HF_2^-$. The $HF_2^-$ can be a preferred species for etching undoped silicon dioxide; such as, for example, silicon dioxide having a total concentration of arsenic, phosphorus and boron of less than or equal to about 0.5 wt %.

Some of the embodiments disclosed herein include methods for selectively etching a first silicon-dioxide-containing-material relative to a second silicon-dioxide-containing-material. The first silicon-dioxide-containing-material has a higher dopant concentration (e.g., a higher total concentration of one or more of phosphorus, boron and arsenic) than the second silicon-dioxide-containing-material. In some embodiments, the first silicon-dioxide-containing-material has a total concentration of one or more of phosphorus, boron and arsenic of greater than or equal to about 0.5 wt %; and may, for example, have a total concentration of said one or more of phosphorus, boron and arsenic within a range from about 0.5 wt % to about 10 wt %. In contrast, the second silicon-dioxide-containing-material has a total concentration of one or more of phosphorus, boron and arsenic of less than or equal to about 1 wt %; and may, for example, have a total concentration of said one or more of phosphorus, boron and arsenic within the range from about 0 wt % to about 0.5 wt %. The term "about" means within reasonable tolerances of fabrication and measurement. Accordingly, the phrase "about 0 wt %" means 0 wt % to within reasonable tolerances of fabrication and measurement.

In some applications doped silicon-dioxide-containing-material may comprise, consist essentially of, or consist of silicon dioxide in combination with one or both of phosphorus and boron; with the total concentration of the phosphorus and boron being within the range from about 0.5 wt % to about 10 wt %.

The term "selective etching" means that a first material is removed faster than a second material; and includes, but is not limited to, processes which are 100% selective for etching the first material relative to the second material.

Figure 1:
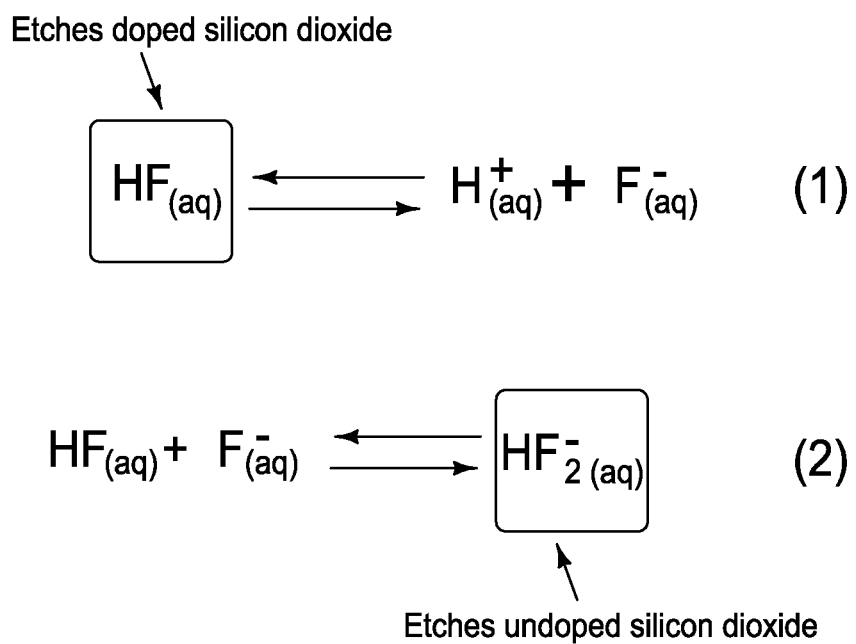
FIG. 1 illustrates a pair of chemical equations.

In some applications, it is recognized that chemistry may be adapted to favor the etching of doped silicon-dioxide-containing-material relative to undoped (or less doped) silicon-dioxide-containing-material if the equilibria of the equations (1) and (2) of FIG. 1 are shifted to favor HF versus $HF_2^-$. Such embodiments may include recognition that such shift may be accomplished by incorporating an organic solvent (specifically, a solvent having a lower dielectric constant (i.e., lower polarity) than water) into an etchant mixture to impede dissociation of the HF, in combination with inclusion of a second acid into the etchant mixture to increase the concentration of protons in solution and thereby shift the dissociation equilibrium of equation (1) of FIG. 1 toward HF.

Figure 2:
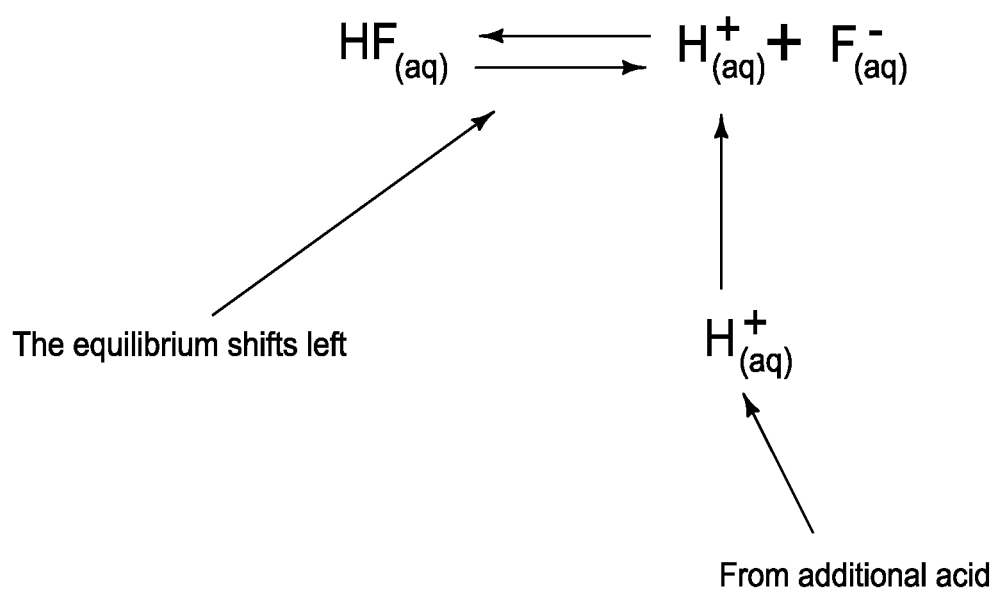
FIG. 2 illustrates another chemical equation and an associated chemical relationship.

The extra protons may shift the dissociation equilibrium through a concept known as Le Chatelier's principle. FIG. 2 illustrates the general concept of Le Chatelier's principal as applied to the equilibrium of undissociated hydrofluoric acid (HF) with protons and fluoride ions. Specifically, if additional protons are added (with such protons coming from additional acid), the protons will shift the equilibrium to the left to increase the relative proportion of the undissociated HF.

Some embodiments include utilization of etching mixtures which contain hydrofluoric acid, a second acid, and a low-polarity organic solvent (where the term "low-polarity" means a polarity less than that of water). The incorporation of the additional acid (e.g., the second acid) and the low-polarity organic solvent increases the relative amount of HF as compared to $HF_2^-$, which enables the etchant mixture to be selective for doped silicon-dioxide-containing-material relative to undoped silicon-dioxide-containing-material.

The second acid preferably is a relatively strong acid, and accordingly has a pKa of less than 5 (or in some applications, less than "about 5"). The term "pKa" is $-\log_{10}(K_a)$, where $K_a$ is the acid dissociation constant of a given acid. In some embodiments, the second acid may have a pKa of less than 0, or even less than −2. In some example embodiments, the second acid may include at least one organic acid (i.e., an acid comprising a carboxylic group) and/or at least one inorganic acid. For instance, the second acid may include one or more of acetic acid, benzoic acid, formic acid, chloroacetic acid, dichloroacetic acid, oxalic acid, fluoroacetic acid, difluoroacetic acid, trifluoracetic acid and trichloroacetic acid. As another example, the second acid may include one or more of HBr, HCl, $HClO_4$, $H_2SO_4$, $H_3PO_4$, $HNO_3$, $HNO_2$, $H_2CrO_4$, $CH_3SO_3H$ and $CF_3SO_3H$.

The low-polarity organic solvent may include one or more ethers and/or one or more esters. For instance, the low-polarity organic solvent may include one or more of ethylene glycol dimethyl ether, ethylene glycol diethyl ether, ethylene glycol dibutyl ether, dioxane, tetrahydrofuran, ethylene glycol methyl ether acetate, ethylene glycol monoethyl ether acetate, ethylene glycol monobutyl ether acetate and propylene glycol monomethyl ether acetate.

In some applications, the etchant mixture includes HF, HCl and propylene glycol monomethyl ether acetate; where the HCl is the second acid and the propylene glycol monomethyl ether acetate is the low-polarity organic solvent.

The relative amounts of the various components within the etchant mixture may be tailored for specific applications. In some embodiments the concentration of the hydrofluoric acid may be within a range from about 0.5 volume percent (vol %) to about 10 vol %; the concentration of the low-polarity organic solvent may be within a range from about 40 vol % to about 99 vol %; and the concentration of the second acid may be within a range from about 0.5 vol % to about 50 vol %. It can be desired that water be kept to a minimum within the etchant mixture in order to keep the polarity low. To the extent that water is present in the etchant mixture, such may be provided to a concentration of less than or equal to about 10 vol %.

In some embodiments the concentration of the second acid within the etchant mixture may be within a range from about 0.5 vol % to about 10 vol %, and the concentration of the low-polarity organic solvent may be within a range from about 80 vol % to about 99 vol %.

In some embodiments the organic solvent may be referred to as an organic substance, a solvent comprising one or more organic substances, a solvent comprising at least one ether and/or at least one ester, etc.

In some embodiments the etchant mixture may include one or more surfactants.

In some embodiments the etchant mixture may include one or more chelating agents.

The etchant mixture may be utilized at any suitable temperature. In some embodiments the etchant mixture is maintained at a temperature within a range from about 5° C. to about 95° C. during an etching process. In some embodiments the etchant mixture is maintained at a temperature within a range from about 20° C. to about 70° C. during an etching process.

The etchant mixture may be utilized at any suitable pressure. In some embodiments the etchant mixture may be at about atmospheric pressure during an etching process.

An example application for the etchant mixtures described above is explained relative to FIGS. 3 and 4.

Figure 3:
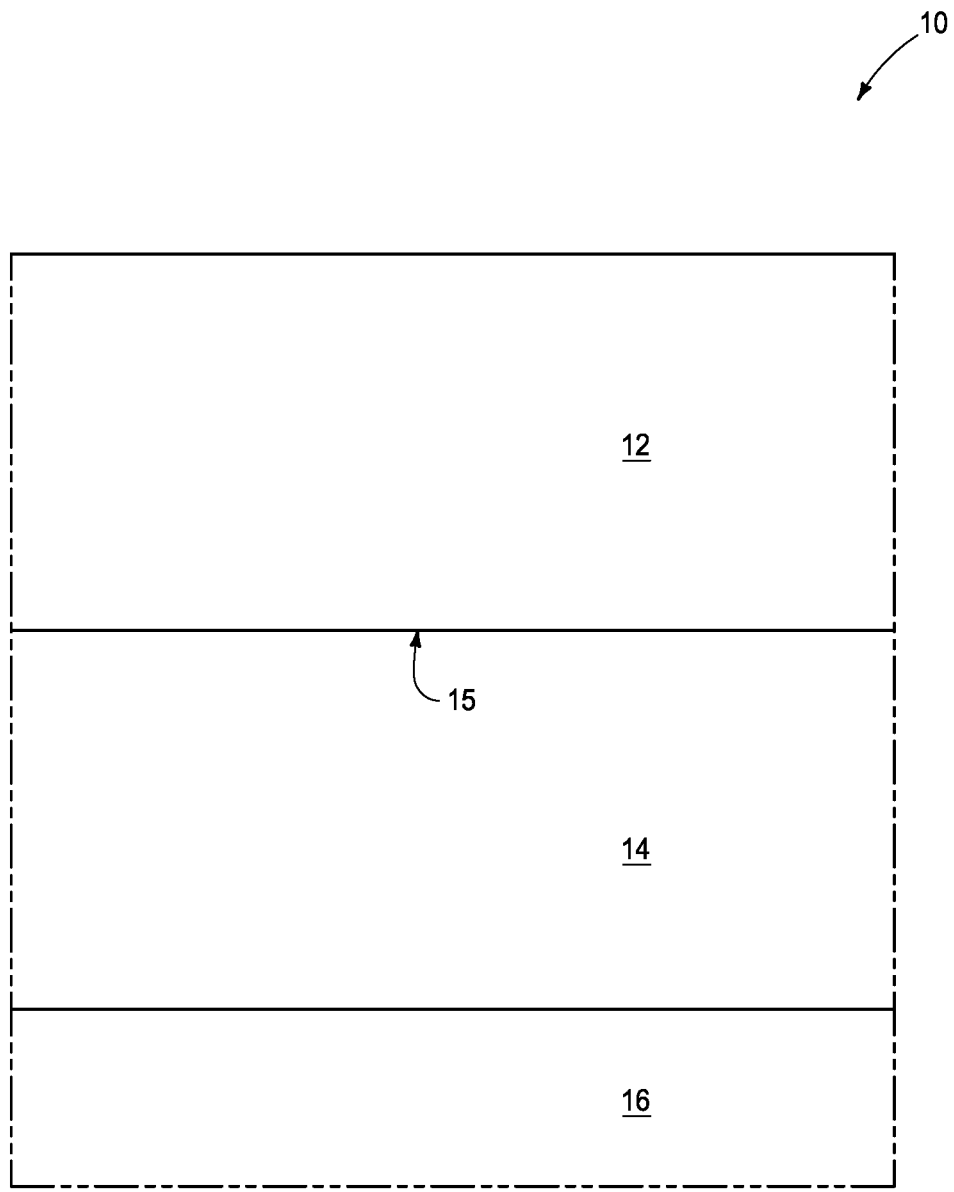
FIGS. 3 and 4 are diagrammatic cross-sectional side views of an example assembly at sequential process stages of an example method.

Referring to FIG. 3, an assembly 10 is formed to have a first silicon-dioxide-containing-material 12 over a second silicon-dioxide-containing-material 14. The second silicon-dioxide-containing-material is supported by a base 16. In some embodiments the assembly 10 may be considered to be "provided" to be in the configuration of FIG. 3; with the term "provided" meaning that the assembly is formed by any suitable method and corresponds to a starting point for subsequent process steps.

The base 16 may comprise semiconductor material; and may, for example, comprise, consist essentially of, or consist of monocrystalline silicon. The base 16 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 16 may correspond to a semiconductor substrate containing one or more materials associated with integrated circuit fabrication. Such materials may include, for example, one or more of refractory metal materials, barrier materials, diffusion materials, insulator materials, etc.

The first silicon-dioxide-containing-material 12 comprises a higher concentration of dopant (e.g., one or more of boron, phosphorus and arsenic) than the second silicon-dioxide-containing-material 14. The relative amount of dopant in the first silicon-dioxide-containing-material 12 and the second silicon-dioxide-containing-material 14 may correspond to the compositions described above. For instance, a total concentration of dopant within the first silicon-dioxide-containing-material may be within a range from about 0.5 wt % to about 10 wt %; and a total concentration of dopant within the second silicon-dioxide-containing-material may be within a range from about 0 wt % to about 1 wt %.

The materials 12 and 14 join at an abrupt interface 15 where the low dopant concentration of material 14 transitions to the high dopant concentration of material 12.

Figure 4:
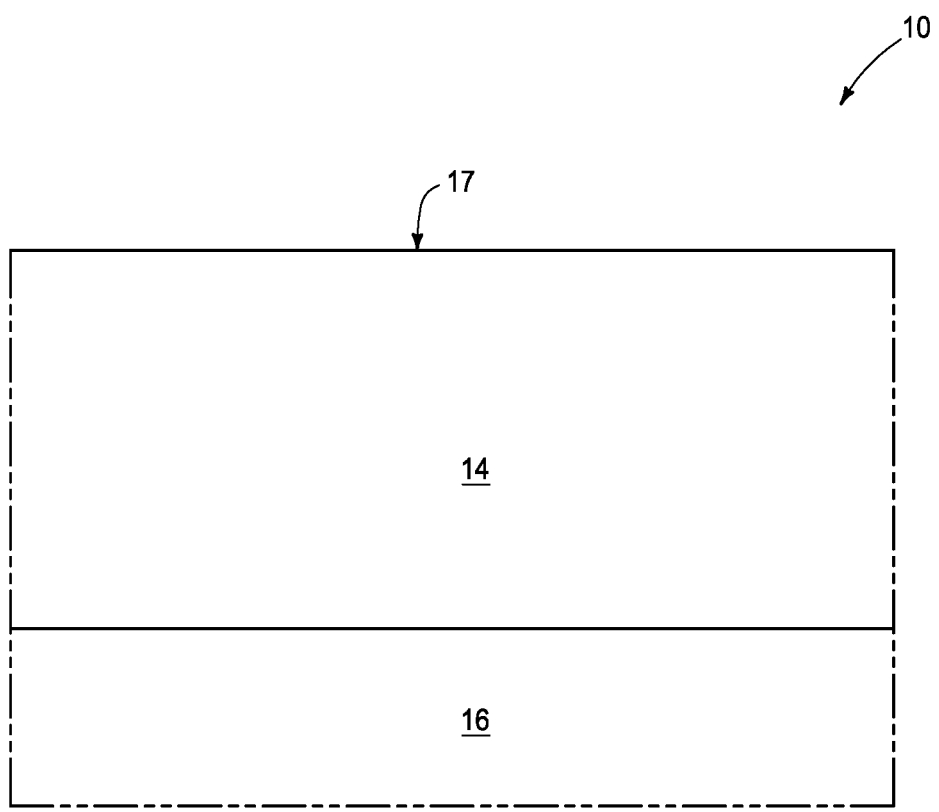

Referring to FIG. 4, the assembly 10 is shown after the etchant described above (i.e., the etchant comprising HF, second acid and low-polarity solvent) is utilized to selectively remove the first silicon-dioxide-containing-material 12 (FIG. 3) from over the second silicon-dioxide-containing-material 14. Such exposes an upper surface 17 of material 14 at an approximate location of the interface 15 of FIG. 3.

Figure 5:
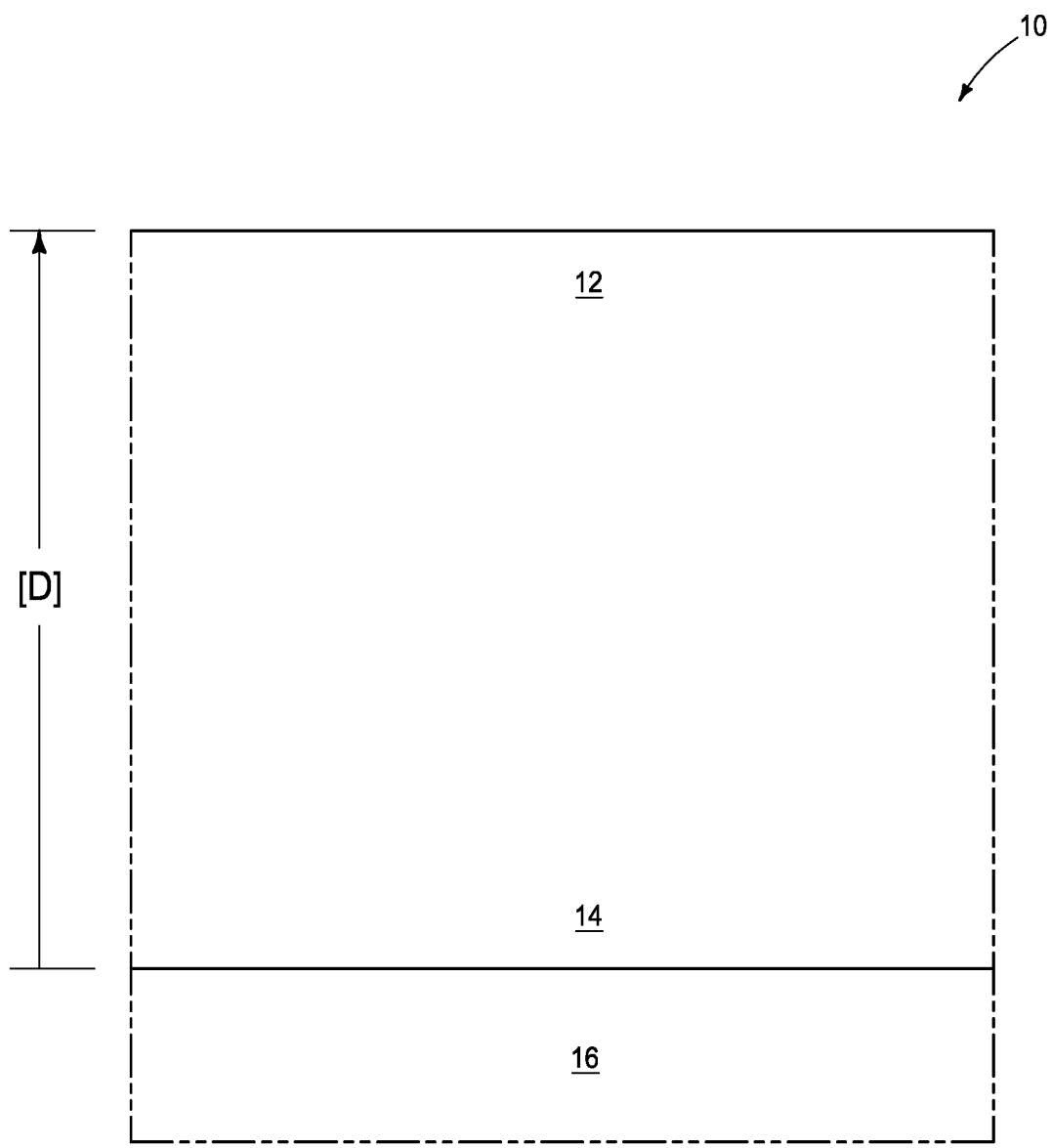
FIGS. 5 and 6 are diagrammatic cross-sectional side views of an example assembly at sequential process stages of an example method.
Figure 6:
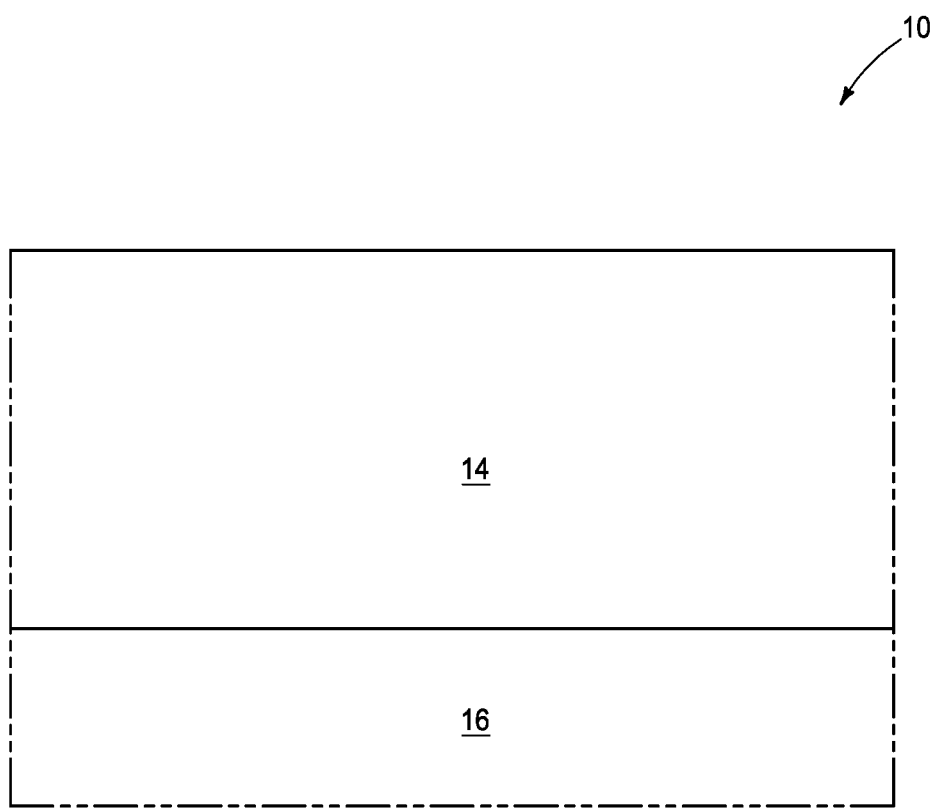

FIGS. 5 and 6 illustrate another example embodiment.

Referring to FIG. 5, the assembly 10 comprises the doped first silicon-dioxide-containing-material 12 over the undoped (or less doped) second silicon-dioxide-containing-material 14. However, a gradient of dopant concentration extends from the material 14 to the material 12. Such gradient is diagrammatically illustrated along the left side of the assembly 10 as a dopant concentration [D] which increases along an upward direction from the material 14 to the material 12. The gradient may be a linear gradient, or may be any other suitable gradient.

Referring to FIG. 6, the doped first silicon-dioxide-containing-material 12 is removed. The location where the etch terminates along the dopant gradient (the dopant gradient [D] is shown in FIG. 5) may be determined by the composition of the etchant mixture, the duration of the etch, the temperature of the etch, the concentration of dopant along various regions of the dopant gradient, etc. Accordingly, the configuration of FIG. 5, the composition of the etchant mixture, and the processing conditions utilized during etching with the etchant mixture may be tailored to terminate an etch at a desired location of a dopant gradient within a silicon-dioxide-containing-material.

Another example embodiment utilizing the above-described etchant mixtures is explained with reference to FIGS. 7-14.

Referring to FIG. 7, an assembly (construction) 50 is formed to include a stack 52 of alternating silicon-dioxide-containing-material tiers 54 and lattice-material tiers 56. In the illustrated embodiment, the silicon-dioxide-containing-material tiers 54 include a first silicon-dioxide-containing-material tier comprising the first silicon-dioxide-containing-material 12, and include a second silicon-dioxide-containing-material tier comprising the second silicon-dioxide-containing-material 14. The second silicon-dioxide-containing-material is over the first silicon-dioxide-containing-material 12, and is spaced from the first silicon-dioxide-containing-material 12 by an intervening one of the lattice-material tiers 56. Accordingly, in the embodiment of FIG. 7 the first and second silicon-dioxide-containing-materials 12 and 14 do not directly contact one another. In other embodiments, the first and second silicon-dioxide-containing-materials 12 and 14 may directly contact one another.

The silicon-dioxide-containing-materials 12 and 14 may comprise the same compositions described above with reference to FIG. 3.

The lattice-material tiers 56 comprise lattice-material 58. The lattice-material may comprise any suitable composition(s); and in some embodiments may comprise, consist essentially of, or consist of silicon nitride.

The illustrated stack comprises three lattice-material tiers 56. In other embodiments the stack may include more than three of such tiers or fewer than three of such tiers. Also, in other embodiments the stack may include additional silicon-dioxide-containing-material tiers 54 besides the illustrated two tiers.

The stack 52 is supported by the semiconductor base 16. The base 16 of FIG. 7 may comprise the same compositions described above with reference to FIG. 3. In the shown embodiment, a conductive plug 60 is provided within the base 16 and is directly under the stack 52. The conductive plug 60 comprises conductive material 62. The conductive material 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some applications, the conductive plug 60 is electrically coupled with a source/drain region of a transistor, as described in more detail below with reference to FIG. 14. The transistor may be provided at the processing stage of FIG. 7, or at a later processing stage.

Referring to FIG. 8, an opening 64 is extended through the upper two lattice-material tiers 56, and through the second silicon-dioxide-containing-material 14.

The opening 64 may be formed by providing a patterned mask over the stack 52 to define a location of the opening, and then etching into the materials 58 and 14 with one or more appropriate etches. The patterned mask is not shown in FIG. 8, but persons of ordinary skill will recognize that the patterned mask may or may not be remain after the opening 64 is patterned into the uppermost lattice-material tier 58.

The opening 64 may have any suitable shape when viewed from above, and may be circular, elliptical, square, rectangular, etc. FIG. 8A shows a top view of the assembly 50 illustrating an example embodiment in which the opening 64 is circular-shaped when viewed from above.

The opening 64 has vertical sidewalls 63 along the materials 14 and 58.

Referring to FIG. 9, the opening 64 is extended through the first silicon-dioxide-containing-material 12, through the bottom lattice-material tier 56, and to an upper surface of the conductive plug 60. In some embodiments, the opening may be extended into the conductive plug, rather than stopping at the upper surface of the conductive plug.

The opening has tapered sidewalls 65 along the first silicon-dioxide-containing-material 12. Such tapered sidewalls may be problematic, in that they narrow the bottom region of the opening 64 which may render it difficult to form conductive materials within the opening at later process stages. The tapered sidewalls may result from a difficulty in flowing etchant into the bottom of the opening 64, and may become increasingly problematic as openings are scaled to increasingly higher aspect ratios in order to achieve more highly-integrated structures associated with future architectures.

Some embodiments utilize the etchant mixtures described above to selectively remove the silicon-dioxide-containing-material 12 relative to the silicon-dioxide-containing-material 14 so that the sidewalls 65 may be straightened. The etchant mixtures may also selectively remove the silicon-dioxide-containing-material 12 relative to the lattice-materials 58 and the conductive material 62 of the conductive plug 60.

Referring to FIG. 10, the assembly 50 is shown at a process stage subsequent to that of FIG. 9, and specifically after an etchant mixture containing hydrofluoric acid, second acid and low-polarity solvent is utilized to straighten the tapered sidewalls along the silicon-dioxide-containing-material 12. The straightening of the tapered sidewalls may be considered to extend the straight sidewalls 63 to be along the first silicon-dioxide-containing-material 12. FIG. 10 also shows that additional etching has been utilized to extend the straight sidewalls 63 of opening 64 through the bottom lattice-material tier 56.

The opening 64 of FIG. 10 may be utilized for any suitable application. In some embodiments, the opening is utilized for fabrication of a capacitor.

Referring to FIG. 11, a first electrode material 66 is formed within the opening 64 and is patterned into a first electrode (first capacitor electrode) 68. The electrode 68 is shaped as an upwardly-opening container in the shown embodiment. The electrode material 66 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The electrode material 66 may be considered to line the opening 64.

Referring to FIG. 12, the silicon-dioxide-containing-materials 12 and 14 are removed to leave voids 70 adjacent outer sidewalls of the first electrode 68.

Referring to FIG. 13, capacitor dielectric material 72 is formed to line the voids 70, and to line an interior of the opening 64. The dielectric material 72 may comprise any suitable composition(s); and in some embodiments may comprise, consist essentially of, or consist of silicon dioxide.

The capacitor dielectric material 72 narrows the opening 64, and may be considered to narrow the upwardly-opening container defined by the container-shaped electrode 68.

Referring to FIG. 14, second electrode material 74 is formed within the narrowed opening 64 (FIG. 13), and within the lined voids 70 (FIG. 13). The second electrode material 74 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The second electrode material 74 forms a second capacitor electrode 76. The second capacitor electrode is electrically coupled with a reference voltage 84. The reference voltage may be any suitable reference voltage; including, for example, ground, VCC/2, etc.

The electrodes 68 and 76, together with the dielectric material 72 between them, form a capacitor 78. In some embodiments, the opening 64 of FIG. 13 may be one of many substantially identical openings formed across a memory array region (with the term "substantially identical" meaning identical to within reasonable tolerances of fabrication and measurement). In such embodiments, the capacitor 78 may be one of many substantially identical capacitors of a memory array 80. For instance, the memory array may comprise hundreds, thousands, millions, hundreds of millions, etc., of the capacitors.

The capacitor 78 may be incorporated into a memory cell. Specifically, the capacitor may be coupled with an access transistor 82. In the illustrated embodiment, the access transistor has one source/drain region 81 which is electrically coupled with the conductive plug 60, and has another source/drain region 83 which is electrically coupled with a digit line DL. The access transistor 82 also has a gate 85 which is electrically coupled with a wordline WL. The digit line, wordline and access transistor may be formed at any suitable process stage(s). Such process stage(s) may include one or more process stages before the formation of the capacitor 78 and/or one or more process stages subsequent to the formation of the capacitor 78.

The capacitor 78 and the access transistor 82 may together form a memory unit (memory cell) 90 within a dynamic random access memory (DRAM) array 80. FIG. 15 shows a region of an example DRAM array 80. The DRAM array comprises wordlines (WL1-WL4) and digit lines (DL1-DL4), and comprises a plurality of the memory units 90. Each of the memory units is uniquely addressed by one of the wordlines in combination with one of the digit lines.

It is noted that some components may be inherently unstable in some of the etchant formulations described herein (for instance, some of the esters may be inherently unstable in some of the etchant formulations). The components are referred to as being "inherently unstable" to indicate that they may degrade upon incorporation into the etchant formulations. In some applications it may be desirable to mix etchant formulations immediately prior to utilizing the etching formulations (i.e., to incorporate point-of-use mixing) rather than attempting to stockpile batches of the etchant formulations for later use.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method in which an assembly is formed to have a first silicon-dioxide-containing-material and a second silicon-dioxide-containing-material. The first silicon-dioxide-containing-material has a higher concentration of dopant therein than does the second silicon-dioxide-containing-material. The first silicon-dioxide-containing-material is selectively removed relative to the second silicon-dioxide-containing-material using a mixture which includes hydrofluoric acid, a second acid and an organic solvent. The organic solvent may include at least one ester and/or at least one ether. The second acid may have a pKa of less than 5.

Some embodiments include a method of forming an integrated assembly. A construction is formed to comprise a first silicon-dioxide-containing-material under a second silicon-dioxide-containing-material. The first silicon-dioxide-containing-material is more heavily doped with one or more of phosphorus, boron and arsenic than the second silicon-dioxide-containing-material. The first and second silicon-dioxide-containing-materials are etched to form an opening extending into the first and second silicon-dioxide-containing-materials. The opening has a tapered sidewall along the first silicon-dioxide-containing-material. The tapered sidewall is straightened with an etch selective for the first silicon-dioxide-containing-material relative to the second silicon-dioxide-containing-material. The etch uses a mixture comprising hydrofluoric acid, a second acid and an organic solvent. The second acid has a pKa of less than 5.

Some embodiments include a method of forming an integrated capacitor. A construction is formed to comprise a stack of alternating silicon-dioxide-containing-material tiers and lattice-material tiers. The silicon-dioxide-containing-material tiers include a first silicon-dioxide-containing-material tier under a second silicon-dioxide-containing-material tier, and spaced from the second silicon-dioxide-containing-material tier by one of the lattice-material tiers. The silicon-dioxide-containing-material of the first silicon-dioxide-containing-material tier is a first silicon-dioxide-containing-material, and the silicon-dioxide-containing-material of the second silicon-dioxide-containing-material tier is a second silicon-dioxide-containing-material. The first silicon-dioxide-containing-material is more heavily doped with one or more of phosphorus, boron and arsenic than is the second silicon-dioxide-containing-material. The first and second silicon-dioxide-containing-material tiers are etched to form an opening extending into the first and second silicon-dioxide-containing-material tiers. The opening has a tapered sidewall along the first silicon-dioxide-containing-material tier. The tapered sidewall is straightened with an etch selective for the first silicon-dioxide-containing-material relative to the second silicon-dioxide-containing-material. The etch uses a mixture comprising hydrofluoric acid, a second acid and an organic solvent comprising at least one ether and/or at least one ester. The second acid has a pKa of less than 5. After straightening the tapered sidewall, a first electrode material is formed within the opening to line an interior of the opening and narrow the opening. The first electrode material is patterned into a first capacitor electrode. The first and second silicon-dioxide-containing-materials are removed to leave voids adjacent the first capacitor electrode. A capacitor dielectric material is formed within the voids to line the voids, and is formed within the narrowed opening to line the narrowed opening. A second capacitor electrode is formed within the lined narrowed opening and within the lined voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated capacitor, comprising:
   providing a construction comprising a stack of alternating silicon-dioxide-containing-material tiers and lattice-material tiers; the silicon-dioxide-containing-material tiers including a first silicon-dioxide- containing-material tier under a second silicon-dioxide-containing-material tier, and spaced from the second silicon-dioxide-containing-material tier by one of the lattice-material tiers; the silicon-dioxide- containing-material of the first silicon-dioxide-containing-material tier being a first silicon-dioxide-containing-material, and the silicon-dioxide-containing-material of the second silicon-dioxide-containing-material tier being a second silicon-dioxide-containing-material; the first silicon-dioxide-containing-material being more heavily doped with one or more of phosphorus, boron and arsenic than the second silicon-dioxide-containing-material;
   etching into the first and second silicon-dioxide-containing-material tiers to form an opening, the opening having a tapered sidewall along the first silicon-dioxide-containing-material tier;

straightening the tapered sidewall with an etch selective for the first silicon-dioxide-containing-material relative to the second silicon-dioxide-containing-material; the etch using a mixture comprising hydrofluoric acid, a second acid and an organic solvent comprising at least one ether and/or at least one ester; the second acid having a pKa of less than about 5;

after straightening the tapered sidewall, forming a first electrode material within the opening to line an interior of the opening and narrow the opening; the first electrode material being patterned into a first capacitor electrode;

removing the first and second silicon-dioxide-containing-materials to leave voids adjacent the first capacitor electrode;

forming a capacitor dielectric material within the voids to line the voids, and within the narrowed opening to line the narrowed opening; and forming a second capacitor electrode within the lined narrowed opening and within the lined voids.

2. The method of claim 1 wherein the first and second silicon-dioxide-containing-materials are adjacent one another, and comprising an abrupt interface where the second silicon-dioxide-containing-material joins to the first silicon-dioxide-containing-material.

3. The method of claim 1 wherein the first and second silicon-dioxide-containing-materials are adjacent one another, and comprising a gradient of the concentration of the dopant from the second silicon-dioxide-containing-material to the first silicon-dioxide-containing-material.

4. The method of claim 1 wherein the mixture includes:
a concentration of the hydrofluoric acid within a range from about 0.5 vol % to about 10 vol %;
a concentration of the one or more organic solvent within a range from about 40 vol % to about 99 vol %; and
a concentration of the second acid within a range from about 0.5 vol % to about 50 vol %.

5. The method of claim 4 wherein the mixture further includes water to a concentration of no greater than about 10 vol%.

6. The method of claim 4 wherein:
the concentration of the second acid is within a range from about 0.5 vol % to about 10 vol %; and
the concentration of the one or more organic solvent is within a range from about 80 vol % to about 99 vol %.

7. The method of claim 1 wherein the concentration of the dopant within the first silicon-dioxide-containing-material is within a range from about 0.5 wt % to about 10 wt %; and
wherein the concentration of the dopant within the second silicon-dioxide-containing-material is within a range from about 0 wt % to about 1 wt %.

8. The method of claim 1 wherein the concentration of said dopant within the first silicon-dioxide-containing-material includes boron and phosphorus.

9. The method of claim 8 wherein the concentration of the dopant within the first silicon-dioxide-containing-material is within a range from about 0.5 wt % to about 10 wt %; and
wherein the concentration of the dopant within the second silicon-dioxide-containing-material is within a range from about 0 wt % to about 1 wt %.

10. The method of claim 1 wherein the pKa of the second acid is less than 0.

11. The method of claim 1 wherein the pKa of the second acid is less than −2.

12. The method of claim 1 wherein the second acid includes one or more carboxylic acid-containing compositions.

13. The method of claim 1 wherein the second acid includes one or more inorganic acids.

14. The method of claim 1 wherein a temperature of the mixture during the etching is within a range from about 5° C. to about 95° C.

15. The method of claim 1 wherein the organic solvent includes one or more of ethylene glycol dimethyl ether, ethylene glycol diethyl ether, ethylene glycol dibutyl ether, dioxane, tetrahydrofuran, ethylene glycol methyl ether acetate, ethylene glycol monoethyl ether acetate, ethylene glycol monobutyl ether acetate and propylene glycol monomethyl ether acetate.

16. The method of claim 1 wherein a temperature of the mixture during the etching is within a range from about 20° C. to about 70° C.

17. The method of claim 1 wherein the lattice-material tiers comprise silicon nitride.

18. The method of claim 1 wherein the organic solvent includes propylene glycol monomethyl ether acetate, and wherein the second acid includes HCl.

19. The method of claim 1 wherein the first silicon-dioxide-containing-material has a total concentration of greater than or equal to about 0.5 wt % of said one or more of phosphorus, boron and arsenic.

20. The method of claim 19 wherein the second silicon-dioxide-containing-material has a total concentration of about 0 wt % of said one or more of phosphorus, boron and arsenic.

21. The method of claim 1 wherein the second acid includes one or more of HBr, HCl, $HClO_4$, $H2SO_4$, $H_3PO_4$, $HNO_3$, $HNO_2$, $H_2CrO_4$, $CH_3SO_3H$ and $CF_3SO_3H$.

22. The method of claim 1 wherein the second acid includes one or more of acetic acid, benzoic acid, formic acid, chloroacetic acid, dichloroacetic acid, oxalic acid, fluoroacetic acid, difluoroacetic acid, trifluoroacetic acid and trichloroacetic acid.

23. The method of claim 1 wherein the organic solvent includes at least one ether.

24. The method of claim 1 wherein the organic solvent includes at least one ester.

* * * * *